(12) United States Patent
Breems et al.

(10) Patent No.: US 7,876,250 B2
(45) Date of Patent: Jan. 25, 2011

(54) CALIBRATION CIRCUIT AND METHOD FOR A/D CONVERTER

(75) Inventors: Lucien J. M. Breems, Eindhoven (NL); Robert Rutten, Uden (NL); Hendrik Van Der Ploeg, Waalre (NL)

(73) Assignee: NXP B.V., Eindhoven (NL)

( * ) Notice: Subject to any disclaimer, the term of this patent is extended or adjusted under 35 U.S.C. 154(b) by 238 days.

(21) Appl. No.: 12/294,988

(22) PCT Filed: Mar. 27, 2007

(86) PCT No.: PCT/IB2007/051072

§ 371 (c)(1),
(2), (4) Date: Sep. 29, 2008

(87) PCT Pub. No.: WO2007/113735

PCT Pub. Date: Oct. 11, 2007

(65) Prior Publication Data

US 2010/0176976 A1    Jul. 15, 2010

(30) Foreign Application Priority Data

Mar. 31, 2006  (EP) ................................ 06112125

(51) Int. Cl.
*H03M 3/00* (2006.01)
(52) U.S. Cl. ...................... 341/143; 381/71.3
(58) Field of Classification Search ................ 341/143; 375/376; 381/71.3, 71.4, 94.1; 364/724.19, 364/724.2, 724.16, 724.12, 724.01
See application file for complete search history.

(56) References Cited

U.S. PATENT DOCUMENTS 5,272,446 A * 12/1993 Chalmers et al. ............ 329/304
5,689,572 A * 11/1997 Ohki et al. .................. 381/71.3
5,781,138 A    7/1998 Knudsen
6,271,781 B1   8/2001 Pellon
6,377,196 B1 * 4/2002 Kolsrud et al. .............. 341/118

(Continued)

FOREIGN PATENT DOCUMENTS

EP      1655841 A    5/2006

(Continued)

OTHER PUBLICATIONS

Larsson A et al; "A Background Calibration Scheme for Pipelined ADCS Including Non-Linear Operational Amplifier Gain and Reference Error Correction", SOC Conference 2004. Proceedings. IEEE International, p. 37-40, Sep. 12-15, 2004. Piscataway, NJ, USA, IEEE.

(Continued)

*Primary Examiner*—Joseph Lauture (57) ABSTRACT

An analog to digital conversion circuit comprises a first digital noise cancellation filter (16) configured to provide a signal to cancel quantization noise from an analog to digital converted output signal. In a calibration phase a second digital noise cancellation filter (26) is has an input coupled to an input of the first digital noise cancellation filter (16). Mutually different sets of at least one-filter coefficients are programmed in the first and second digital noise canceling filters (16, 26). A difference is computed of averaged size indications of digital output signals derived using signals from the first and second digital noise cancellation filters (16, 26) using the same input signal. Updates of the sets of at least one filter coefficients are adapted dependent on the difference between the averaged size indications.

11 Claims, 3 Drawing Sheets

U.S. PATENT DOCUMENTS 6,873,281 B1   3/2005   Esterberg et al.
6,907,374 B1   6/2005   Tsyrganovich
6,970,120 B1   11/2005  Bjornsen

OTHER PUBLICATIONS

Cauwenberghs G et al; "Adaptive Digital Correction of Analog Errors in Mash ADC'S-Part I: Off-Line and Blind On-Line Calibration". IEEE Transactions on Circuits and Systems II: Analog and Digital Signal Processing. vol. 47, No. 7. Jul. 2000. pp. 621-628. Piscataway, NJ, USA, IEEE.

Breems L J et al; "A Cascaded Continuous Time Sigma Delta Modulator With 67DB Dynamic Range in 10 MHZ Bandwidth". IEEE Journal of Solid-State Circuits, vol. 39. No. 12, Dec. 2004. pp. 2152-2160. Piscataway, NJ, USA, IEEE.

Neitola, M et al; "Study of Fully Digital Error Correction in Multibit Delta-Sigma A/D Converters"; 0-7803-7448-7/02, IEEE, pp. 624-.

Larson, L E. et al; "Multibit Oversampled $\Sigma$-$\Delta$ A/D Convertor With Digital Error Correction"; Electronic Letters, Aug. 4, 1998; vol. 24, No. 16; p. 1051-1052.

\* cited by examiner

CALIBRATION CIRCUIT AND METHOD FOR A/D CONVERTER

The invention relates to a circuit that comprises an analog to digital conversion circuit and to a method of operating such a circuit.

Calibration is an important aspect of analog to digital conversion circuits. Due to factors like manufacturing spread, temperature effects, aging etc, the circuit parameters of the analog side of such circuits can vary. At different parameter values different digital conversion results will be produced for the same analog signal. One example of the effect of parameter value variation can be observed in sigma delta analog to digital converters. In such circuits parameter variations lead to changes in the distribution of quantization noise over the frequency spectrum.

This need for calibration is particularly pronounced in MASH (Multi stage noise shaping) sigma delta converters, whose operation relies on the existence of a definite relation between the analog circuit parameters of a plurality of analog to digital conversion circuits. To reduce the dependence on such relations MASH sigma delta converters generally provide for some form of in-circuit calibration, wherein certain digital signal processing Parameters are adapted, which affect digital postprocessing of the converted signals to account for the observed behavior of the different analog to digital conversion circuits.

One form of implementation of calibration involves the application of a predetermined test signal to the analog to digital conversion circuit and the selection of the digital circuit parameters to ensure that the response to the test signal after digital signal processing corresponds to a required signal. U.S. Pat. Nos. 6,873,281 and 6,873,281 disclose such circuits. However, the need to generate and apply a test signal complicates the design of such circuits and increases their cost.

Another approach to calibration, which does not require a predetermined test signal, is to include an additional analog to digital conversion circuit of high accuracy with the analog to digital circuit that must be calibrated. This is disclosed, for example, in an article titled "A background calibration scheme for pipelined ADCs including non-linear operational amplifier gain and reference error correction" by A. Larsson and S. Sonskusale, SOC Conf. 2004 Proceedings, IEEE Int'l, 12-15 Sep. 2004 (pages 37-40). In this case, a comparison of measurements on the same analog signal from the two analog to digital conversion circuits can be used to select the digital circuit parameters. However, the additional high accuracy analog to digital conversion circuit increases circuit cost. Moreover, the circuit must temporarily cease to handle normal signals to apply the test signal.

In a further implementation the circuit is kept operable during calibration by providing for an additional analog to digital conversion circuit, which temporarily takes over from the analog to digital conversion circuit to which the test signal is applied. This approach is described in an article titled "Adaptive Digital Correction of Analog Errors in MASH ADC's-Part I: Off-line and Blind On-line Calibration" by Gert Cauwenberghs and Gabor C. Temes, in the IEEE transactions on circuits and systems II: Analog and digital signal processing Vol. 47, No 7 July 2000 (pages 621-628). However, the need to generate and apply a test signal still complicates the design of such circuits and increases their cost.

Another solution is to make use of noise signals to perform calibration. This is described in an article titled "A cascaded continuous time Sigma Delta Modulator with 67 dB dynamic range in 10 Mhz bandwidth", by Lucien J. Breems, Robert Rutten and Gunnar Wetzker, published in the IEEE Journal of Solid-state circuits Vol. 39, No 12, December 2004, pages 2152-2160.

Breems et al. describe a sigma delta analog to digital converter with a first and second sigma delta stage. The first stage performs analog to digital conversion of an input signal and the second stage performs analog to digital conversion of an analog signal that represents quantization errors of the first stage. From the digital output signal of the second stage a correction signal is derived that is added to the digital output signal of the first stage. The correction signal is obtained by applying a digital filtering operation to the digital output signal of the second stage.

The parameters of the digital filtering operation are selected so as to minimize quantization noise in a relevant frequency band in the resulting sum of the signal from the first stage and the correction signal. The set of parameters that minimizes noise depends on the analog circuit parameters of the two stages. This set of parameters is selected using a calibration measurement wherein the overall input of the sigma delta analog to digital converter is short-circuited. This leads to a digital noise signal at the output. The digital filter parameters are selected to minimize the power of this noise signal in a predetermined relevant frequency band.

One problem with this circuit is that it takes a long time to select the parameters of the digital filter. If a short time interval is used to measure the noise power, the resulting power measurement suffers from noise, which makes it difficult to make the parameters of the digital filter converge to the optimal values. The noise in the power measurement can be reduced by averaging power over a longer time interval, but this increases the time needed for calibration.

Among others it is an object to provide for an analog to digital conversion circuit that enables a form calibration wherein noise is used for selecting circuit parameters and wherein less time is needed to select the circuit parameters.

An electronic circuit according to claim 1 is provided. Herein calibration is performed by applying a first and second noise cancellation filter, programmed with mutually different sets of at least one filter coefficient, to a common signal and computing a difference between variances of the signals obtained by applying noise cancellation using the outputs of the first and second noise cancellation filters, or more generally a difference between averaged (e.g. summed) size (e.g. absolute value or square) of the obtained signals. The term difference between the averaged size as used herein covers numbers computed by averaging (e.g. summing) differences between sizes as well as numbers obtained by subtracting averages of the sizes. A set of at least one-filter coefficients for normal operation is selected dependent on the difference between the averaged sizes.

The difference between the values is indicative of a gradient in the variance. When the difference between the values is zero, or near zero an optimal set of at least one coefficient has been found. Preferably, the difference between the values is used to perform successive search cycles. By using a plurality of noise cancellation filters with different coefficients in parallel for the same signal, no long averaging period needs to be used to eliminate effects of that signal on the difference between the averages of indicative values.

In an embodiment the analog to digital conversion circuit comprises a sigma delta converter and the first noise cancellation filter is used to obtain corrections of sigma delta conversion results from digitized quantization errors of the sigma delta converter.

In an embodiment a quadrature modulation circuit wherein the noise cancellation filter of one quadrature branch is temporarily applied to signals from the other branch in parallel with the noise cancellation filter for the other branch to select the filter coefficients for that branch. Thus, no additional noise cancellation filter is needed, determining the difference between averaged sizes.

These and other objects and advantageous aspects of the invention will become apparent from a description of exemplary embodiments, using the following Figures.

Figure 1:
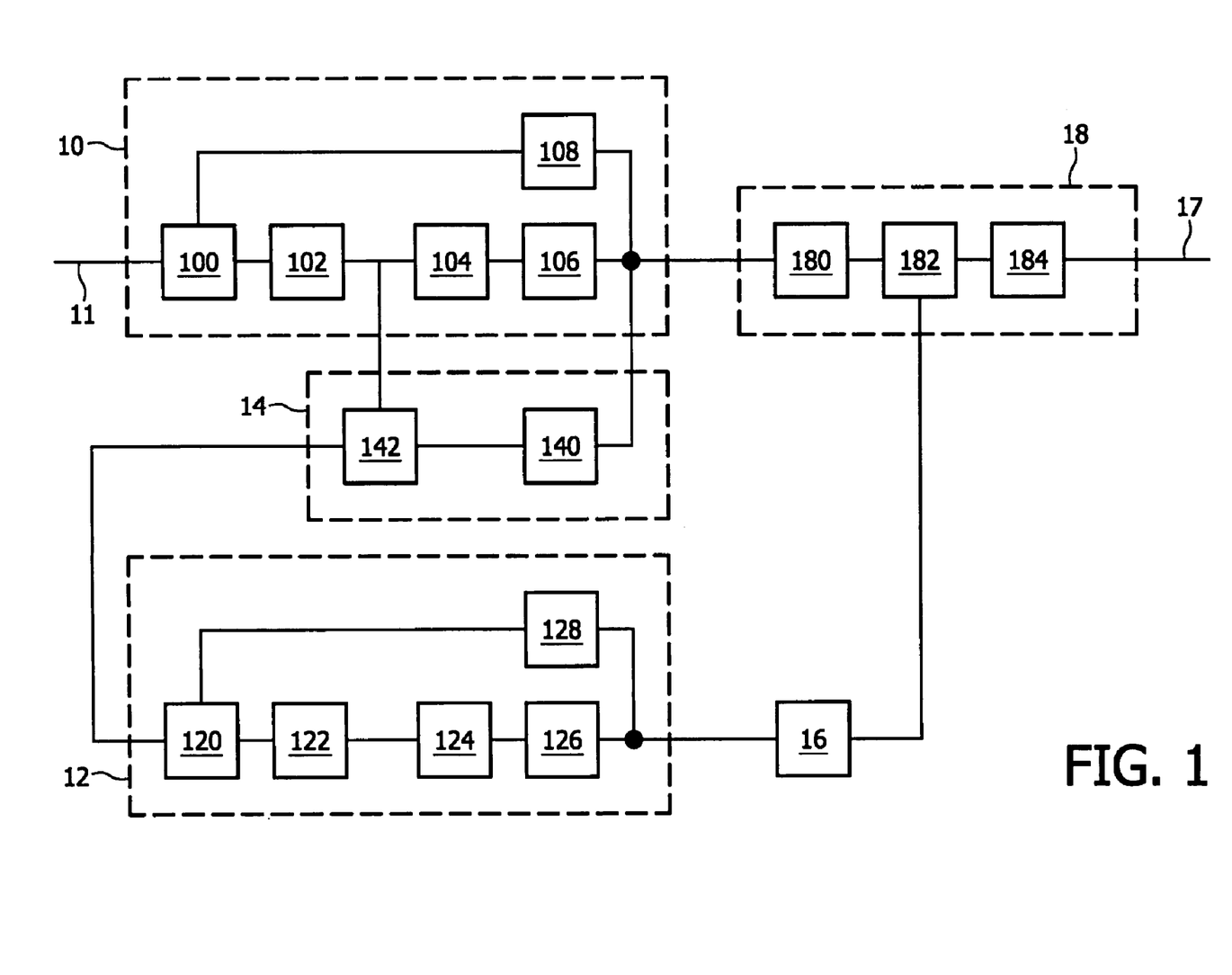
FIG. 1 shows an analog to digital conversion circuit

FIG. 1 shows an analog to digital conversion circuit, comprising a first sigma delta converter 10, a second sigma delta converter 12, a coupling circuit 14, a noise cancellation filter 16 and an output circuit 18. The circuit has an analog input 11 coupled to first sigma delta converter 10 and a digital output 17 coupled to first sigma delta converter 10 via output circuit 18. Digital output 17 may be coupled to further circuits (not shown) that process the resulting signals. First sigma delta converter 10 is coupled to an input of second sigma delta converter 12 via coupling circuit 14. An output of second sigma delta converter 12 is coupled to a correction input of output circuit 18 via noise cancellation filter 16.

First sigma delta converter 10 comprises a series arrangement of a subtractor 100, a loop filter 102, a sampling circuit 104 and a quantizer 106. Furthermore, sigma delta converter 10 comprises a digital to analog converter circuit 108 coupled from an output of quantizer 106 to a subtraction input of subtractor 100. It should be appreciated that the illustrated components of first sigma delta converter 10 primarily represent a functional description of functions performed by the sigma delta converter. In practice a sub-circuit may implement a combination of these functions. In an embodiment quantizer 106 is a single bit quantizer, which simply compares its input signal with a reference level. In another embodiment quantizer 106 may be an analog to digital conversion circuit with multi-bit output, which performs conversion analog signals to multi-bit numbers. Correspondingly digital to analog converter circuit 108 may be simply be a circuit with binary output, or a circuit with a multi-bit digital input, which performs conversion from multi-bit numbers to respective analog levels.

The operation of first sigma delta converter 10 is conventional: subtractor 100 forms an analog difference signal between a input signal from analog input 11 and an analog signal formed from a previously produced digital number from quantizer 106. Loop filter 102 filters the resulting difference signal. Sampling circuit 104 samples the filtered signal under control of a sampling clock signal. Quantizer 106 converts the sampled signal to a next digital number. As is well known the quantization noise that is due to low-resolution accuracy of quantizer 106 is thus shaped by loopfilter 102 to a frequency band where it is not relevant for further processing.

Output circuit 18 contains a series arrangement of a delay circuit 180, an adder 182 and a decimation unit 184. Delay circuit 180 is used to compensate for delays caused by noise cancellation filter 16. Adder 182 adds corrections to the numbers from first sigma delta converter 10 and filters and sub-samples the corrected results to form the digital output signal at digital output 17.

Coupling circuit 14 comprises a digital to analog converter 140 and a subtractor 142. Digital to analog converter 140 has an input coupled to the output of quantizer 106. Subtractor 142 has inputs coupled to an input of sampling circuit 104 and the output of digital to analog converter 140. Thus subtractor 142 produces an analog difference signal that represents an error caused by sampling circuit 104, quantizer 106 and digital to analog converter 140.

Second sigma delta converter 12 is similar to first sigma delta converter, with a subtractor 120, a loop filter 122, a sampling circuit 124, a quantizer 126 and a digital to analog converter circuit 128. The input of second sigma delta converter 12 is coupled to the output of the subtractor 142 of coupling circuit 14 and the output of second sigma delta converter 12 is coupled to the input of noise cancellation filter 16.

Noise cancellation filter 16 is designed to produce an output signal that corrects errors produced by first sigma delta converter 10.

The errors can be illustrated as follows. The output signal Y1(s) of first sigma delta converter 10 is determined by a contribution from the input signal X(s) of first sigma delta converter 10

$$X(s)U1(s)$$

plus quantization noise, due to quantization errors Q1(s) at the output of quantizer 106. The quantization noise in the output signal Y1(s) of first sigma delta converter 12 can be expressed as $$Q1(s)(1-U1(s))$$

Herein U1(s) is the transfer function of first sigma delta converter 10, which can be expressed in terms of the transfer function L1(s) of loop filter 102 according to $$U1(s)=L1(s)/(1+L1(s))$$

A similar relation holds for the output signal Y2(s) of second of first sigma delta converter 12, with the quantization error Q1(s) as input signal instead of input signal X(s), and transfer functions L2(s) and U2(s).

The output signal of noise cancellation filter 16 is H(z)*Y2(z). Herein is the transfer function of noise cancellation filter 16 and the complex number "z" is used instead of frequency "s" to indicate the discrete nature of signal processing by noise cancellation filter 16. For baseband frequencies, the decimation filter 184 is transparent, and as a result output circuit 18 produces for baseband frequencies an output signal $$Y1(z)+H(z)*Y2(z)$$

With a suitable selection of the transfer function H(z) the quantization noise in the output signal Y1 of first sigma delta converter 10 can be minimized. In principle this requires that $$H(z)=-(1-U1(z))/U2(z)$$

When the loop transfer functions L1(z), L2(z) are ratio's N1(s)/D1(s) and N2(s)/D2(s) of polynomials N1(s), N2(s), D1(s) and D2(s), this is equivalent to $$H(z)=-D1(z)*(D2(z)+N2(z))/N2(z)*(D1(z)+N1(z))$$

or, if it may be assumed that (D1(z)+N1(z)) equals (D2(z)+N2(z)) that $$H(z)=-D1(z)/N2(z)$$

In this case, noise cancellation filter 16 can be implemented using a FIR filter with coefficients corresponding to D1(z) and a recursive IIR filter with filter coefficients corresponding to N2(z). A filter with more coefficients is ideally required if the above assumptions are not valid.

It should be noted that the optimal filter coefficients of the noise cancellation filter 16 depend on the parameters of the analog loop filters 102, 122. This presents a problem. Analog loop filters cannot be manufactured so that these parameters have predetermined values with infinite precision. Although the circuit can be designed to realize certain parameter values on average, practical values in a concrete circuit will deviate from the average. Accordingly, it is desirable to provide for calibration circuitry.

Figure 2:
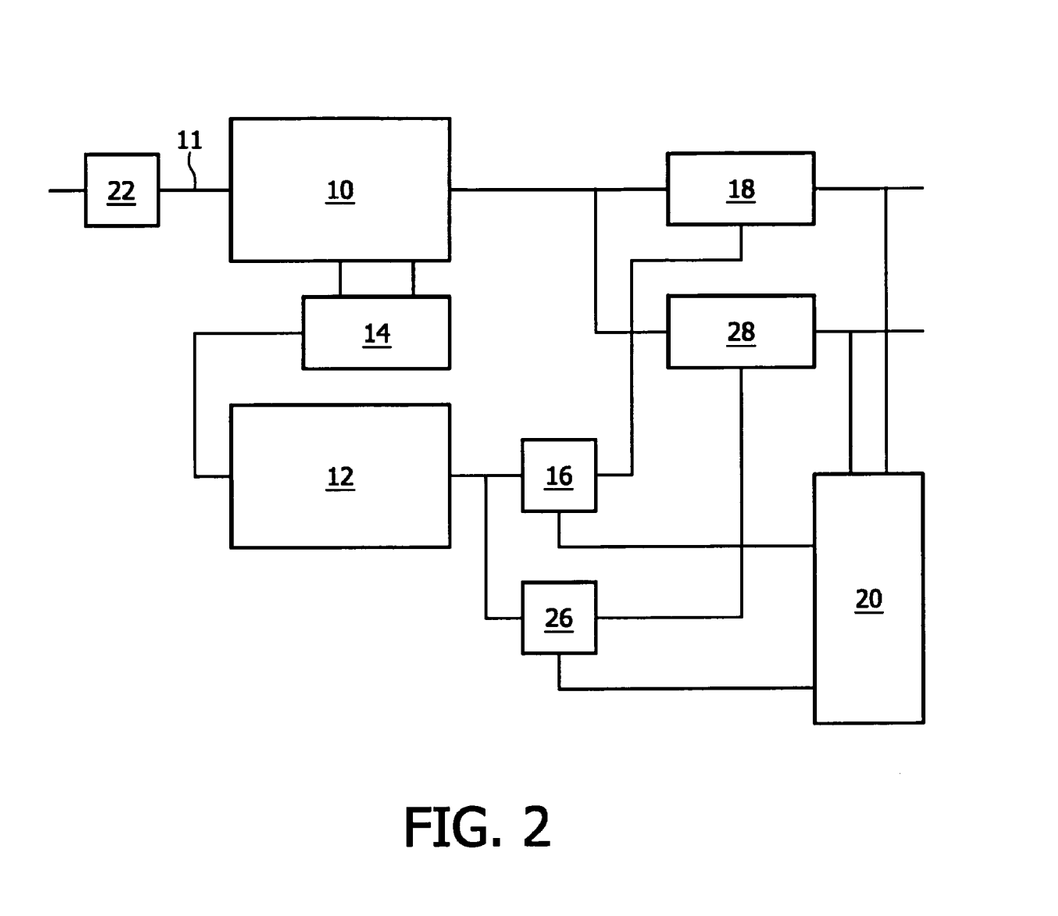
FIG. 2 shows a calibration configuration

FIG. 2 shows a circuit with calibration circuitry. The circuit contains the same elements as in FIG. 1, with the addition of a control circuit 20, an input switch 22, an additional noise cancellation filter 26 and an additional output circuit 28. Input switch 22 is coupled in front of input 11. Additional output circuit 28 receives inputs from the digital output of first sigma delta converter 10 and a correction signal from second sigma delta converter 12, the latter via additional noise cancellation filter 26. Control circuit 20 has inputs coupled to the outputs of output circuit 28 and additional output circuit 18 and outputs coupled to control inputs of switch 22, noise cancellation filter 16 and additional noise cancellation filter 26.

Control circuit 20 is used to adapt the filter coefficients of noise cancellation filter 16 so as to realize optimal noise cancellation. Control circuit 20 can be switched to a normal operation mode and to a calibration mode. In the normal operation mode control circuit 20 switches input switch 22 to allow input signals to pass to analog input 11. In the calibration mode control circuit 20 switches the circuit to a calibration state wherein input switch 22 short circuits the input 11 of first sigma delta converter 12. This has the effect that the circuit will idle, producing a signal representative of zero analog input plus quantization and thermal noise.

In the calibration mode control circuit 20 sets the filter coefficients of the noise cancellation filter 16 and the additional noise cancellation filter 26 to respective sets of coefficients. Control circuit 20 introduces a slight difference between the sets, even though the same input signal, and the same conversion signal Y2(z) is used as input for the noise cancellation filters 16, 26. Thus, slightly different correction signals will result from filtering of the output signal from second sigma delta converter 12. Next, control circuit 20 inputs output signals from output circuit 18 and additional output circuit 28 obtained from the same signal Y2(z) using the slightly different filter settings. Control circuit 20 computes the squares of these results and sums these squares for each output circuit 18, 28. The resulting sums represent variances of the two signals, which will be compared to each other. Alternatively control circuit 20 subtracts the squares from the different output circuits 18, 28 and sums the differences. This requires less bits for the sum. The number of samples used for the sum is selected sufficiently large that a predicted error in the difference between the variances for randomly possible input signals is (well) below the threshold mentioned in the following. It should be noted that summing is a form of averaging (in a strict sense, averaging may contain normalizing the sum for the number of terms in the sum, but as used herein averaging also refers to summing without such normalization).

When the filter coefficients are left and right around the optimal value of the noise cancellation filter 16, the difference between the variances will be zero or near-zero, so the optimal value will be the average of the two filter coefficient values. When the filter coefficients are at a distance from the optimal value, the same difference between the sets of coefficients will result in a larger difference between the variances of the output signals.

Accordingly, control circuit 20 compares the size of the difference between the variances with a threshold value. The threshold value is selected above a predicted difference between the variances that will result for a given difference between the sets of coefficients, when the sets of coefficients are sufficiently near the optimal set. The threshold value is selected below a predicted difference between the variances that results for the given difference between the sets of coefficients when the sets of coefficients not sufficiently near the optimal set. If the size of the difference between the variances is below the threshold or equal to it, control circuit returns to the normal mode. The filter coefficients of noise cancellation filter 16 may be left unchanged from their last value during calibration, but in an embodiment control circuit 20 sets the filter coefficients of noise cancellation filter 16 to an average of the coefficients of the last two sets when switching to the normal mode, to further optimize noise cancellation.

If the difference between the variances is above the threshold, control circuit 20 selects a new pair of nearly equal sets of coefficients for the noise cancellation filters 16, 26 and repeats the previous steps. The use of a threshold is only one possible embodiment of a way to terminate the search for coefficient values. In an alternative embodiment, the steps are simply repeated a predetermined number of times. This predetermined number is set larger than an average number op repetitions needed to reach the threshold. A suitable pretermined number can be easily found by trying increasing numbers until a number is found that produces a difference below the threshold in a number of test. It has been found that the required number of repetitions does not vary greatly. At the end of the predetermined number of repetitions the last or before last set of coefficients from the last or before last repetition of the step is selected for further use. In practice these are the same as sets of coefficients from earlier repetitions when the search has converged in the predetermined number of cycles.

Control circuit 20 may use any one of various methods for selecting the new set of coefficients for the noise cancellation filters 16, 26. For example, techniques may be used that are known from the art of estimating optimal model parameters by minimizing a gradient of a quality criterion, as another example know methods of searching for a maximum or minimum of a function using computed gradients may be used, the difference between the variance taking the part of the gradient. In a simple embodiment, the set of coefficients that yielded the lowest variance is reused and another set is generated that differs from the reused set in the opposite way compared to the set of coefficients that yielded the highest variance. In another embodiment the two variances are used to predict a linear relation between the difference between the sets of coefficients and the variance, and new sets of coefficients are used that lie around a set of coefficients that makes this linear produce a zero variance.

In an embodiment wherein the noise cancellation filters 16, 26 have only one independently variable coefficient (or a plurality of coefficients whose values depend on a single control value), each new pair of sets of coefficients may be selected by selecting a new value for the independent coefficient (or the control parameter) each time until the difference between the variances drops below the threshold, or, in alternatively, after a predetermined number of repetitions of selecting a set of coefficients. In this embodiment the difference between the sets of coefficients in the noise cancellation filters 16, 26 corresponds to a difference in value of the independent coefficient (or the control parameter).

In another embodiment the noise cancellation filters 16, 26 have a plurality of independently variable coefficients. In this embodiment control circuit 20 preferably successively uses different difference vectors between the sets of coefficients in the noise cancellation filters 16, 26, in order to compute successive differences between variances. In this embodiment control circuit 20 preferably changes the sets of differences along successively different vectors until the difference between the variances drops below the threshold, or until a predetermined number of updates have been performed. Techniques from model parameter estimation theory may be used to select the successive vectors, or known gradient based search technique for searching for a maximum minimum of a function of a plurality of arguments may be used to select the successive vectors for example.

Although an example has been shown wherein variances (sums of squares) are used as a measure to determine whether an optimal set of coefficients has been obtained, it should be appreciated that alternatively other measures may be used, such as a differences between sums of absolute values of output signals from output circuits 18, 28, higher powers of the output signals, or other functions of the outputs such as saturating functions that increase with increasing absolute value of the output signals and saturate for larger values, etc.

As will be appreciated, because the same signal is used simultaneously in both noise cancellation filters 16, 26 and output circuits 18, 28 the described technique does not require storage and reproduction of the signal from the sigma delta converters 10, 12, or the application of a stored test signal to the input 11. Because the same signal is applied to both noise cancellation filters 16, 36, effects to the use of random signals largely affect both filters in the same way, so that the effect of these random signal is largely eliminated from the difference between the variances. This means that a relatively short noise quantity estimation time can be used.

Figure 3:
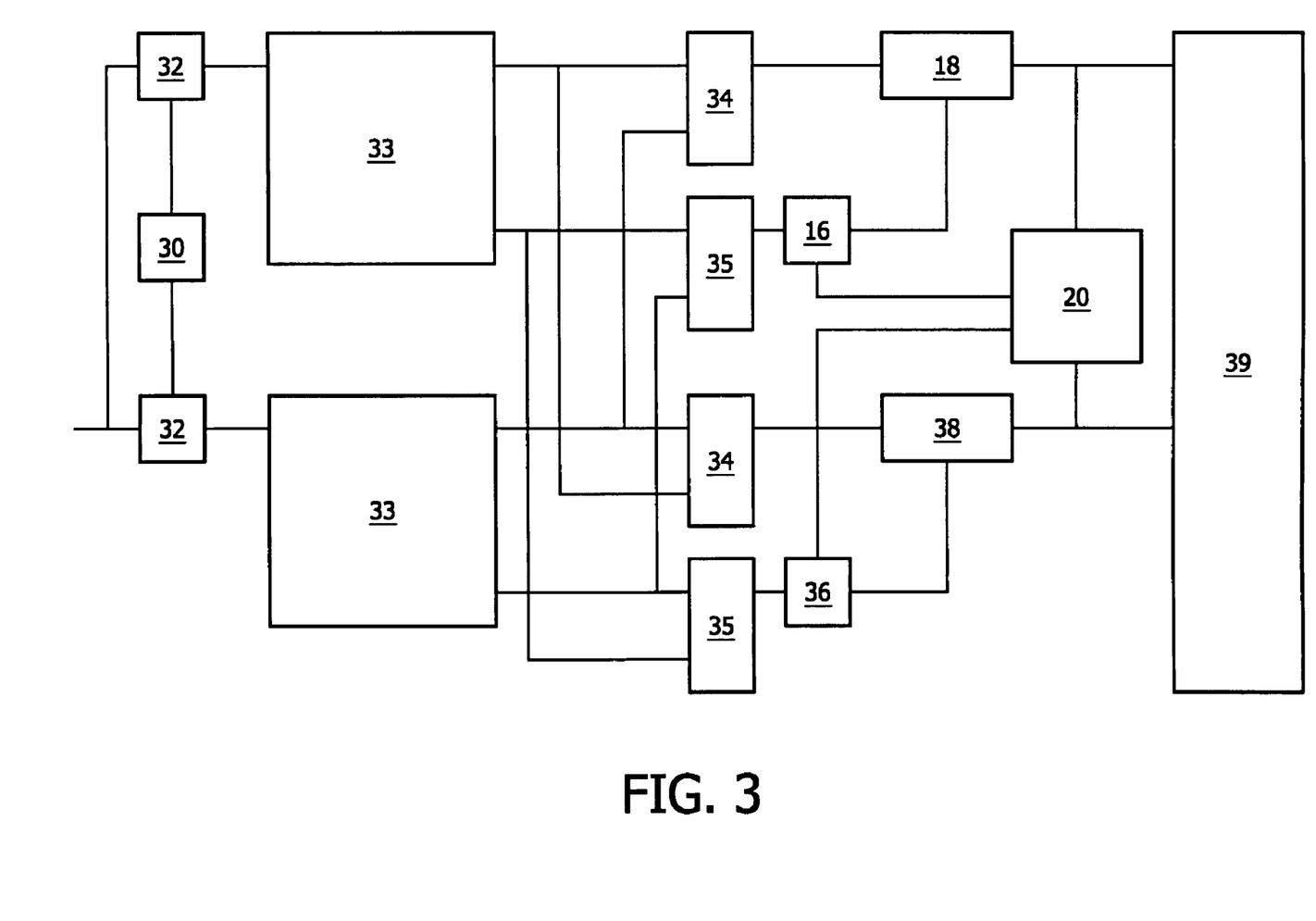
FIG. 3 shows quadrature signal processing circuit

FIG. 3 shows a quadrature conversion circuit, comprising a local oscillator 30, a pair of mixers 32, analog to digital conversion circuits 33, output circuits 18, 38, noise cancellation filters 16, 36, a control circuit 20 and a further circuit 39. Mixers 32 each receive a signal from a signal input and respective quadrature output of local oscillator 30. Mixers 32 have outputs coupled to analog to digital conversion circuits 33, which may each include a first and second sigma delta converter and a coupling circuit as shown in FIG. 1. Each analog to digital conversion circuit 33 has a pair of outputs, coupled to a respective output circuit 18, 38, one via a respective noise cancellation filter 16, 36. The outputs of output circuits 18, 38 coupled to further circuit 39, which is configured to perform further processing of the digital signals during normal operation.

In addition, the circuit comprises digital multiplexers 34, 35 coupled between the analog to digital conversion circuit 33 on one hand, and output circuit 18, 38, and noise cancellation filter 16, 36 on the other hand. Multiplexers 34, 35 are arranged to make it possible to switch between three modes under control of control circuit 20 (via multiplex control connections that are not shown for the sake of clarity). In a first mode, a first analog to digital conversion circuit 33 has a first output coupled to a first output circuit 18 and a second output coupled to a correction input of the first output circuit 18 via a first noise cancellation filter 16. In this first mode, a second analog to digital conversion circuit 33 has a first output coupled to a second output circuit 38 and a second output coupled to a correction input of the second output circuit 38 via a second noise cancellation filter 36.

In a second mode the first analog to digital conversion circuit 33 has its first output coupled to both the first and second output circuit 18, 38 and its second output coupled to the correction inputs of the first and second output circuit 18, 38 via the first and second noise cancellation filter 16, 36 respectively. A third mode is similar to the second mode, except that the second analog to digital conversion circuit 33 takes over the role of the first analog to digital conversion circuit 33.

In operation, during normal operation the circuit operates in the first mode. During a calibration phase, control circuit 20 switches the circuit first to the second mode, to selects the filter coefficients for the first noise cancellation filter 16, as described in the context of FIG. 2. Control circuit 20 then stores the selected set of coefficients and switches the circuit to the third mode. In this third mode control circuit 20 selects the filter coefficients for the second noise cancellation filter 36, as described in the context of FIG. 2. Subsequently control circuit 20 sets the coefficients of the noise cancellation filters 16, 36 to the selected sets and returns the circuit to the first mode.

Preferably, during the second and third mode, the inputs of first and second analog to digital conversion circuit 33 are short-circuited respectively, to that the relevant analog to digital conversion circuit 33 idles during calibration. In an embodiment first and second analog to digital conversion circuit 33 contain a first and second sigma delta converter and a coupling circuit as shown in FIG. 1. As will be appreciated the embodiment of FIG. 3 has the advantage that no additional noise cancellation filter or output circuit is needed to optimize the filter coefficients.

It should be appreciated that the embodiments that have been described have been described by way of example. Various alterations are possible. For example, instead of two sigma delta converters 10, 12 and a coupling circuit 14 a cascade of more than two sigma delta converters coupled by respective coupling circuits may be used, the output signal being a sum of output signals from these sigma delta converters, filtered by respective noise cancellation filters. In this case, a similar calibration technique may involve diffrences between pairs of variances obtained from the same signal with slightly different filters. In this case, the difference in variance obtained with all sigma delta converters may be used, the coefficients of all noise cancellation filters being adapted together. Alternatively, the coefficients of successive noise cancellation filters may be adapted successively for noise cancellation filters for successively higher order corrections, pairs of variances being obtained using different coefficients only for the noise cancellation filter under optimization.

Furthermore, although an application to a particular type of conversion circuit of FIG. 1 has been shown, it should be appreciated that a similar calibration technique may be applied to selection of coefficients for quantization noise cancellation filters in any other analog to digital correction circuit. By applying a current signal to two noise cancellation filters with slightly different coefficients, computing a difference between variances of the resulting output signals and adapting the filter coefficients until the difference between the variances drops below a threshold, or until a predetermined number of update cycles has been performed, it can be ensured that an optimum set of coefficients can be selected.

Preferably the input of the digital to analog converter is short circuited, during the search for filter coefficients. This ensures that the signal at the output is entirely due to quantization noise. However, other signals may be used at the input during calibration. For example a constant non-zero signal may be used. When the difference between the simultaneously used sets of filter coefficients for the different noise cancellation filters is selected so that the filters produce the same responses to DC signals this does not affect the search for the optimum coefficients. Similarly, time varying signals, such as a band-limited signal may be used at the input when the differences between the simultaneously used sets of filter coefficients do not result in different responses to this signal.

Although embodiments have been shown wherein two noise cancellation filters are used in parallel to compute one difference between variances, it should be appreciated that more noise cancellation filters can be used in parallel. In this case a larger number of differences between variances can be computed. This larger number of differences can be used for example to select a vector of updates to the filter coefficients in the search for a optimal set of filter coefficients, or to select which of the filter coefficient will be updated as a next step in the search. Also, it is not necessary in this case to use the noise cancellation that is used during normal operation also as one of the plurality of noise cancellation filters that is used during calibration.

In an embodiment calibration is performed once, for example after manufacturing, after which the selected coefficients are stored in the circuit, for example in a non-volatile memory. In another embodiment calibration is performed each time on reset (including startup) of the circuit. In another embodiment calibration is performed regularly during operation. It is not necessary that the complete search for an optimal set of coefficients is performed at once. Alternatively, different measurements of differences between variances may be performed interrupted by a time interval of normal operation. This reduces the maximum duration of time that normal operation needs to be interrupted. It also has the advantages that an adaptation can be may to gradually varying circuit parameters. Calibration, or individual measurement of difference between variances may be performed for example during reception of a part of an input signal that is known to be compatible with measurement of differences between variances.

Although control circuit 20 is shown as a separate circuit dedicated to updating coefficients, it should be appreciated that in practice a general purpose circuit may be used that also performs other functions. In one embodiment a programmable circuit is used, programmed with a program to perform the search for optimal filter coefficients.

The invention claimed is:

1. An electronic circuit, comprising:
   an analog to digital conversion circuit having an analog input and a digital output;
   a first digital noise cancellation filter coupled between the analog input and the digital output, to cancel noise from an analog to digital converted signal;
   a second digital noise cancellation filter configured to be at least temporarily coupled between an input of the first digital noise cancellation filter and a further digital output;
   a control circuit configured to perform a calibration of noise cancellation by programming respective sets of at least one filter coefficient into the first and second digital noise cancellation filters, with a difference between the sets of at least one filter coefficient, computing a difference between averaged size indications of signal values at the digital output and the further digital output obtained using a same input signal and the sets of at least one filter coefficients and to select a set of at least one filter coefficients for normal operation dependent on the difference between the averaged size indications, wherein the control circuit is configured to perform repeated cycles, each cycle comprising programming respective pairs of sets of filter coefficients into the first and second digital noise cancellation filters, with a difference between the sets of each pair and computing a difference between averaged size indications of signal values, the control circuit being configured to adapt sets of filter coefficients in successive cycles for a predetermined period of time and thereupon switching operation with a last or before last determined set of filter coefficients using operational input signals.

2. The electronic circuit according to claim 1, further comprising:
   a switching circuit coupled to the analog input, the control circuit being arranged to control the switching circuit to apply a noise signal to the analog input during calibration.

3. The electronic circuit according to claim 1, wherein the analog to digital conversion circuit further comprises:
   a sigma delta converter;
   an error conversion circuit, coupled to the sigma delta converter to digitize quantization errors of the sigma delta converter, the error conversion circuit coupled to the input of the first noise cancellation filter;
   an output circuit coupled between an output of the sigma delta converter circuit and the digital output, the output circuit having a correction input coupled to an output of the first noise cancellation filter.

4. The electronic circuit according to claim 3, further comprising:
   a further output circuit with an input coupled to the output of the sigma delta converter circuit;
   a correction input coupled to an output of the second noise cancellation filter; and
   an output coupled to the further digital output.

5. The electronic circuit according to claim 4, wherein the output circuit and the further output circuit each further comprise:
   a decimation filter; and
   a sub-sampling unit.

6. The electronic circuit according to claim 1, wherein, the control circuit adapts sets of filter coefficients in successive cycles until the difference between the averaged size indications drops below a threshold value.

7. The electronic circuit according to claim 1, further comprising:
   a quadrature demodulation circuit, with a first and second branch for digitizing respective quadrature signal components, the first branch comprising the analog to digital conversion circuit and the first digital noise cancellation filter, the second branch comprising a further analog to digital conversion circuit, the control circuit being configured to switch the electronic circuit between a normal mode of operation wherein the second digital noise cancellation filter is coupled to the further analog to digital conversion circuit for canceling noise and a calibration mode wherein the second digital noise cancellation filter is coupled to the analog to digital conversion circuit for determining the difference between averaged size indications values.

8. A method of operating an analog to digital conversion circuit, the method comprising:
   providing a first digital noise cancellation filter configured to provide a signal to cancel quantization noise from an analog to digital converted output signal;
   starting a calibration phase wherein a second digital noise cancellation filter is used, with an input coupled to an input of the first digital noise cancellation filter;
   programming mutually different sets of at least one filter coefficients in the first and second digital noise canceling filters;
   computing a difference of averaged size indications of digital output signals derived using signals from the first and second digital noise cancellation filters using the same input signal;

adapting updates of the sets of at least one filter coefficients dependent on the difference between the averaged size indications;

programming respective pairs of sets of filter coefficients into the first and second digital noise cancellation filters, with a difference between the sets of each pair;

computing a difference between averaged size indications of signal values;

adapting sets of filter coefficients in successive cycles for a predetermined period of time; and switching operation with a last or before last determined set of filter coefficients using operational input signals.

9. The method according to claim 8, further comprising:

applying a nominally constant noisy analog signal to the analog input during the calibration phase.

10. The method according to claim 8, further comprising:

searching for an optimal set of filter coefficients by executing successive cycles; each comprising programming a respective pair of mutually different sets of at least one filter coefficients in the first and second digital noise canceling filters; and computing a difference of averaged size indications of digital output signals derived using signals from the first and second digital noise cancellation filters using the same input signal.

11. The method according to claim 8, further comprising:

using a quadrature demodulation circuit, with a first and second branch, comprising said analog to digital conversion circuit and a further analog to digital conversion circuit respectively; and switching the quadrature demodulation circuit between a normal operating mode, wherein the second digital noise cancellation filter operates to cancel noise in the second branch, and a calibration mode, wherein the second digital noise cancellation filter operates with its input coupled to the input of the first digital noise cancellation filter to compute the difference of averaged size indications.

* * * * *